(12) United States Patent
Kitazaki

(10) Patent No.: US 6,172,936 B1
(45) Date of Patent: *Jan. 9, 2001

(54) MEMORY CIRCUIT

(75) Inventor: Kazuhiro Kitazaki, Kawasaki (JP)

(73) Assignee: Fujitsu Limited, Kawazaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/256,087

(22) Filed: Feb. 24, 1999

(30) Foreign Application Priority Data

May 28, 1998 (JP) ................................. 10-146765

(51) Int. Cl.$^7$ ...................................... G11C 8/00
(52) U.S. Cl. ..................... 365/233; 365/226; 711/103; 711/166; 711/167
(58) Field of Search .................. 365/185.33, 233, 365/226; 327/142, 143; 711/103, 167, 166

(56) References Cited

U.S. PATENT DOCUMENTS 5,696,917  12/1997  Mills et al. .
5,757,715   5/1998  Williams et al. .
6,026,465 * 2/2000  Mills et al. ..................... 711/103

FOREIGN PATENT DOCUMENTS 0 561 370  9/1993  (EP) .
0 591 009  4/1994  (EP) .

* cited by examiner

Primary Examiner—Richard Elms
Assistant Examiner—VanThu Nguyen
(74) Attorney, Agent, or Firm—Armstrong, Westerman, Hattori, McLeland & Naughton

(57) ABSTRACT

The present invention comprises a flash memory or similar nonvolatile memory circuit characterized by a constitution that enables read operations in two modes, a clock-synchronous burst read mode and a clock-asynchronous normal read mode, the device being set to normal read mode in response to power on, and being set to burst read mode in response to a control signal instructing the burst read mode. The memory device includes a burst mode switching circuit internally. This burst mode switching circuit sets an output circuit to normal read mode in response to the power ON so as to enable read operations not synchronized with the clock after the power ON. In response to a burst mode control signal provided by the system, the burst mode switching circuit sets the output circuit to burst read mode. Thus, the system can perform the burst read to the nonvolatile memory device under the environment analogous to conventional main memory access.

10 Claims, 8 Drawing Sheets

SYSTEM EMPLOYING FLASH MEMORY

BURST READ MODE

NORMAL READ MODE

ERASE, PROGRAM

FIG.7

| CASE | PO | /RST | /IA | BURST | OPERATION CONDITION |
|------|----|------|-----|-------|---------------------|
| 1 | L | X | X | L | POWER ON |
| 2 | H | L | X | L | RESET |
| 3 | | H | L | H | BURST READ |
| 4 | | | H | L | NON-BURST READ |

BURST MODE SWITCHING CIRCUIT (2)

FIG.9

| CASE | PO | /RST | SET | /WE | I/O | /IA | BURST | OPERATION CONDITION |
|------|----|------|-----|-----|-----|-----|-------|---------------------|
| 10 | L | X | X | X | X | X | L | POWER ON |
| 11 | H | L | X | X | X | X | L | RESET |
| 12 | | H | L | L | X | L | - | INVALID |
| 13 | | | | H | X | H | L | COMMAND INPUT |
| 14 | | | | | X | L | H | BURST READ |
| 15 | | | | L | X | H | L | NON-BURST READ |
| 16 | | | | | X | L | - | INVALID |
| 17 | | | H | H | X | H | L | COMMAND INPUT |
| 18 | | | | | X | L | - | INVALID |
| 19 | | | | | L | H | L | NON-BURST MODE SET |
| 20 | | | | | H | H | H | BURST MODE SET |

MEMORY CIRCUIT

BACKGROUND OF THE INVENTION

1. Field of the Invention

The present invention relates to a nonvolatile semiconductor memory circuit, such as a flash memory, and particularly to a memory device capable of being switched between asynchronous read operations and clock-synchronous read operations.

2. Description of the Related Art

Semiconductor memory devices offer fast access times, and are utilized in computer systems for main memories and other memories of which fast access times are required. On the other hand, semiconductor memory devices are unsuited to storing large programs and large quantities of data; accordingly, hard disks are used in such large capacity memory applications. Of the various semiconductor memory devices, dynamic RAM is used principally for main memories. DRAM is a volatile memory that loses stored data when the power is shut off, and thus while suited to storing data or programs that are to be held in memory on a temporary basis, it is unsuited to storing the BIOS routine read out during computer boot-up, or other such programs.

Nonvolatile memories have attracted attention for the ability to hold stored data even when the power is shut off. In particular, flash memories that use nonvolatile memory, while presenting a certain limitation in terms of erase operations, are nonvolatile memories which, due to the basic operating principle of such memories, are capable of holding stored data even when power is shut off. Another advantage is faster access times than hard disks and other external memory devices. In computer systems offered in recent years, it has become common practice to store in flash memory the BIOS routine that is read out automatically at computer boot-up.

Operations executed at boot-up of a computer include automatic accessing of the flash memory in which the BIOS is stored and reading of the BIOS data at power-on; reading out the operating system (OS) stored on the hard disk; and placing this data in the dynamic RAM main memory. During subsequent execution of an application program, the OS placed in the main memory is serially read, and application program stored on the hard disk or other external memory device is executed. The dynamic RAM offered in recent years, such as SDRAM, are synchronous memories in which read operations are synchronized with the clock. Burst mode read operation, in which a continuous multiple-bit data stream is output synchronized with the clock, is an indispensable capability in terms of fast reads. Burst reads allow the OS to be read from the main memory at high speeds.

Conventional flash memory, on the other hand, is asynchronous memory, which has to wait for a given access time before reading out data stored at a given address in response to input of the address.

The OS generally consists of a smaller amount of data than does an ordinary application program; thus, as flash memory capacities have become greater, it has become possible to store the OS in flash memory, provided that there is sufficient data capacity to accommodate the OS. Storing the OS in flash memory obviates the need to transfer it to main memory from the hard disk, thereby significantly reducing the time required to boot up the computer. Since conventional flash memory is asynchronous, it is not possible for the system to perform the burst read operation on the flash memory storing the OS that are performed on the main memory. The slowness of read operations to flash memory diminishes the attractiveness of proposals to store the OS and other programs in flash memory.

Accordingly, it is an object of the present invention to provide a flash memory or similar nonvolatile memory circuit that is capable of clock-synchronous read operation.

It is another object of the present invention to provide a flash memory or similar nonvolatile memory circuit that is capable of burst read operation.

Yet another object of the present invention is to provide a flash memory or similar nonvolatile memory circuit that is capable of both clock-synchronous read operation and clock-asynchronous read operation. One other object of the present invention is to provide a flash memory that, viewed from the system end, is capable of conventional clock-asynchronous read operation, that is further capable of clock-synchronous read operation analogous to those for main memory, and that can be switched between the two modes as required.

Yet another object of the present invention is to provide a flash memory capable of being switched as appropriate between asynchronous read operation and burst read operation.

SUMMARY OF THE INVENTION

To achieve the foregoing objects, the present invention comprises a flash memory or similar nonvolatile memory circuit characterized by a constitution that enables read operations in two modes, a clock-synchronous burst read mode and a clock-asynchronous normal read mode, the device being set to normal read mode in response to power on, and being set to burst read mode in response to a control signal instructing the burst read mode. The memory circuit includes a burst mode switching circuit internally. This burst mode switching circuit sets an output circuit to normal read mode in response to the power ON so as to enable read operations not synchronized with the clock after the power ON. In response to a burst mode control signal provided by the system, the burst mode switching circuit sets the output circuit to burst read mode. Thus, the system can perform the burst read to the nonvolatile memory device under the environment analogous to conventional main memory access.

To achieve the foregoing objects, the present invention provides a memory circuit including nonvolatile memory cells, comprising: an output circuit for executing clock-synchronous burst read operation and clock-asynchronous normal read operation of data read from the memory cells, and a burst mode switching circuit for setting the output circuit to the normal read mode in response to power ON, and for setting the output circuit to the burst read mode in response to a specific control signal provided from outside.

According to the above invention, operations are performed in normal read mode when the power is turned on, and are set to burst read mode in response to a control signal instructing the burst read mode, allowing the system to be set to clock-asynchronous operation mode and clock-synchronous operation mode during power-on and subsequent operations.

To achieve the foregoing objects, the present invention further provides a memory circuit capable of being switched in response to a burst control signal between a clock-synchronous first read mode and a clock-asynchronous second read mode, wherein, in the first read mode, address signals are acquired in synchronous with the clock during a first control signal being at activation level, and a plurality of read data are output in synchronous with the clock during a second control signal being at activation level after a prescribed time interval since the first control signal being at the activation level, comprising: a burst mode switching circuit for setting the burst control signal to the second read mode condition when the power is turned on, and for setting the burst control signal to the first read mode condition in response to the first control signal being at the activation level.

According to the above invention, the memory device is forced to operate in clock-asynchronous normal read mode when the power is turned on, and is capable to operate in clock-synchronous burst read mode in response to a burst mode read instruction signal subsequently.

BRIEF DESCRIPTION OF THE DRAWINGS

FIG. 7 shows a truth table for operation of the burst mode switching circuit of FIG. 6;

FIG. 9 shows a truth table for operation of the burst mode switching circuit of FIG. 8.

DESCRIPTION OF THE PREFERRED EMBODIMENTS

Preferred embodiments of the present invention are presented with reference to the accompanying drawings; however, the technological scope of the present invention is not limited to the embodiments disclosed herein.

Figure 1:
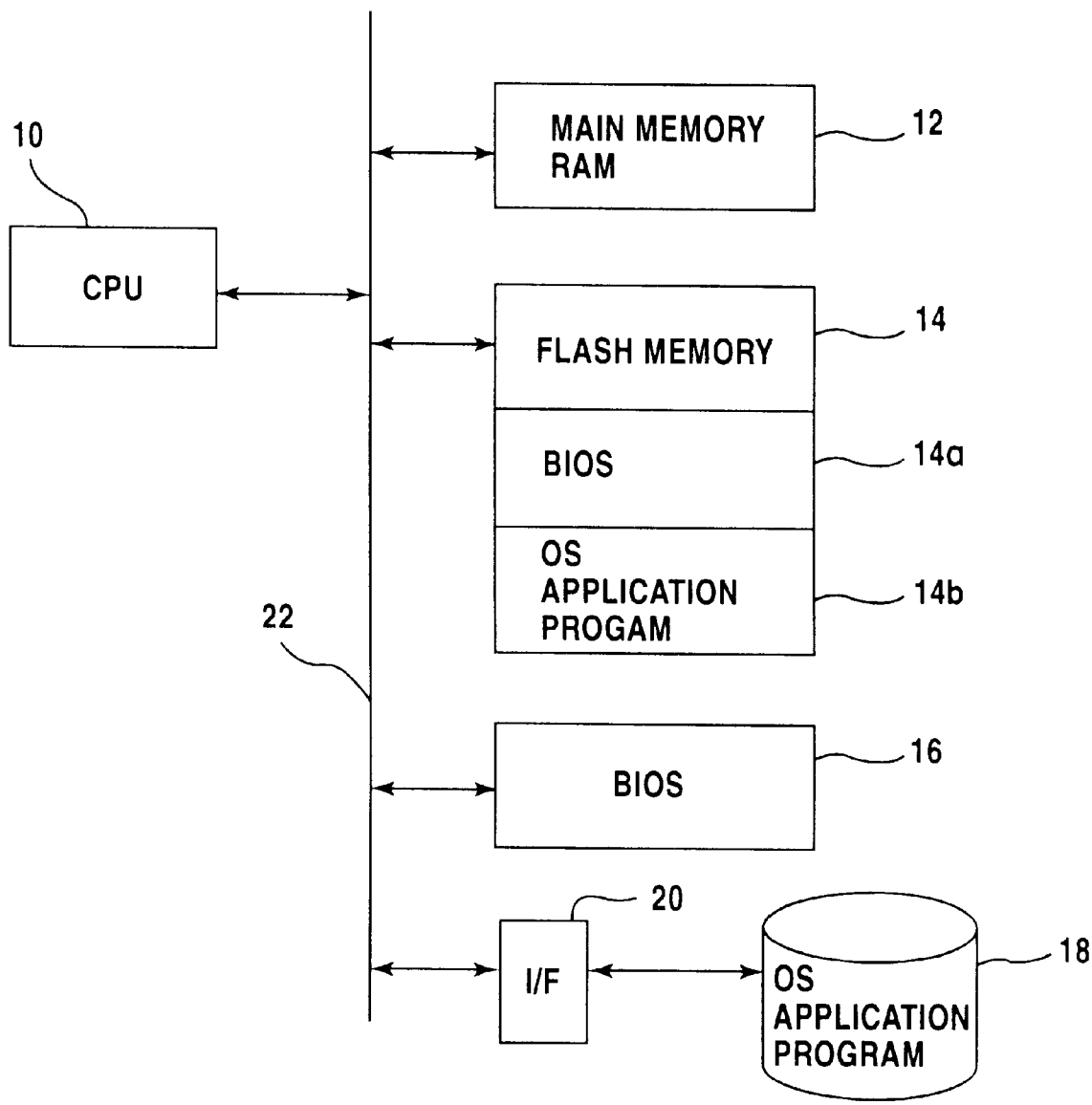
FIG. 1 depicts an example of a system employing a flash memory constituting the nonvolatile memory device of the present invention.

FIG. 1 depicts an example of a system employing a flash memory constituting the nonvolatile memory device of the present invention. The system in this example is a personal computer or similar system. A CPU 10 is connected via a bus 22 to a main memory 12, flash memories 14 and 16, and an external storage device 18. The external storage device 18 is a hard disk, for example, and is connected to the bus 22 via a specific interface 20. An operating system (OS) and other application programs are stored in the external storage device 18. The flash memory 16 is used as the boot ROM when the computer is turned on, and contains the BIOS, for example. The flash memory 16 used as boot ROM ordinarily operates under clock-asynchronous mode. Either of the flash memories 14 and 16 may be used. The flash memory 14 constitutes the nonvolatile memory device of the present invention, as will be described later.

The main memory 12 comprises a high-speed semiconductor memory device whose internal operations are synchronized with the clock, such as a synchronous DRAM (SDRAM). Thus, the main memory 12 can be operated in at least clock-synchronous burst read mode under the control of the CPU 10 or a memory controller (not shown).

Accordingly, when the computer is powered on, the CPU 10 first reads the BIOS from the flash memory 16 (boot ROM). This read operation takes place in clock-asynchronous normal read mode. The OS stored in the external storage device 18 is subsequently read out into the main memory 12, whereupon the CPU 10 reads the appropriate instructions from the OS to execute the desired application programs. The CPU 10 reads the OS in clock-synchronous high-speed read mode from the main memory 12.

The flash memory according to the present invention supports both clock-asynchronous normal read mode and clock-synchronous burst read mode. Thus, in ordinary system operating environments, it is possible for the OS stored in the external storage device 18, as well as the BIOS, to be stored in the flash memory 14. When the power is turned on, the BIOS is read out from the flash memory 14 in clock-asynchronous normal read mode, and the OS is subsequently read in clock-synchronous burst read mode analogous to the read from main memory 12. Accordingly, no modification by the CPU 10 for BIOS read control from the conventional flash memory 16 and for OS read control from the main memory 12 is required. Since the OS is already stored in the flash memory 14, the need to transfer it from the external storage device 18 to the main memory 12 for storage therein during power-on is obviated, significantly reducing the time required for the computer to boot up.

By storing an OS representing a relatively small amount of data in the flash memory and providing the flash memory with a burst read mode in the manner taught above, it is possible to reduce the time required for the personal computer to boot up. In similar fashion, application software startup time can be reduced by storing the application programs having relatively small amounts of data in the flash memory. OS or program reading from main memory are performed by the CPU 10 or memory controller (not shown) in a manner analogous to the reading of data stored in main memory.

Figure 2:
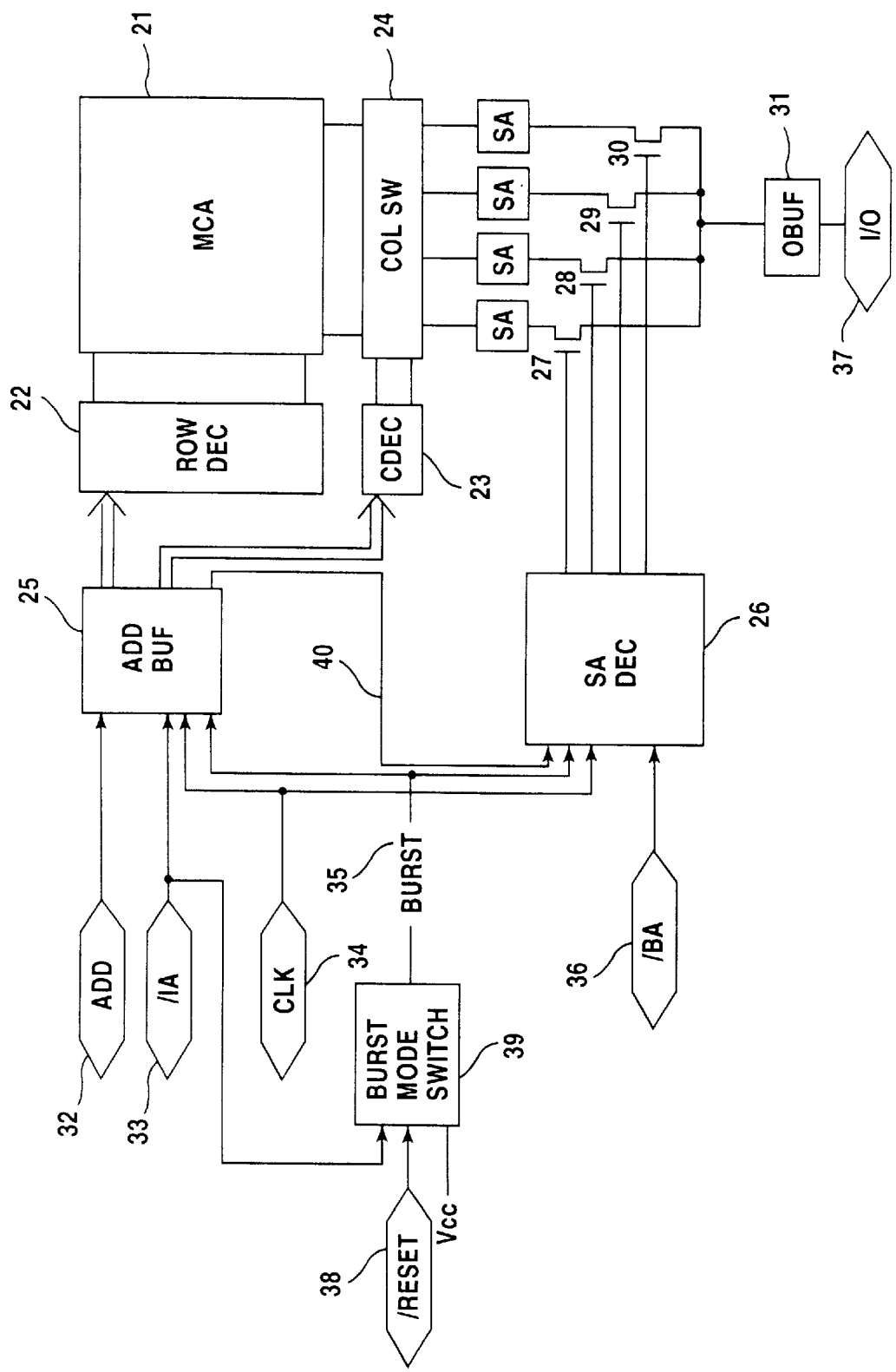
FIG. 2 depicts a flash memory configuration pertaining to an embodiment of the present invention.

FIG. 2 is a schematic of a flash memory pertaining to an embodiment of the present invention. The flash memory of FIG. 2 includes a nonvolatile memory cell array 21, a row decoder 22 for selecting word lines therein, a column decoder 23 for selection in the column direction, and a column selection circuit 24 coupling bit lines selected by the column decoder 23 to sense amps SA. Also provided are an address buffer 25 for acquiring a plurality of addresses (ADD) 32 and delivering the addresses to the row decoder 22 and the column decoder 23, and a sense amp decoder 26 for controlling the output gate transistors 27–30. The sense amp decoder 26 controls the output gate transistors 27–30 in conductive so that the outputs of the four sense amps SA are appropriately delivered to the output buffer 31. Addresses (ADD) 32, an initial address (/IA) 33 that functions as a control signal, and a clock (CLK) 34 are presented to the address buffer 25. The clock (CLK) 34, 2-bit addresses 40 from the address buffer 25, and burst address (/BA) 36 which function as control signal are presented to the sense amp decoder 26. Also provided is a burst mode switching circuit 39 which is presented with the initial address (/IA) 33 and a reset signal (/RESET) 38. The burst mode switching circuit 39 generates a burst control signal (BURST) 35 presented to the internal address buffer 25 and sense amp decoder 26.

The sense amp decoder 26, the output gate transistors 27–30, and the output buffer 31 together constitute an output circuit. On the basis of the burst control signal 35, read operations are performed in either clock-synchronous burst read mode or clock-asynchronous normal read mode. The burst control signal 35 is also presented to the address buffer 25, and in response to the burst control signal 35, the address buffer 25 acquires externally supplied addresses 32 on a synchronous basis with respect to the clock 34. Where the burst control signal 35 indicates non-burst mode, the address buffer 25 acquires addresses 32 on an asynchronous basis with respect to the clock 34.

Figure 3:
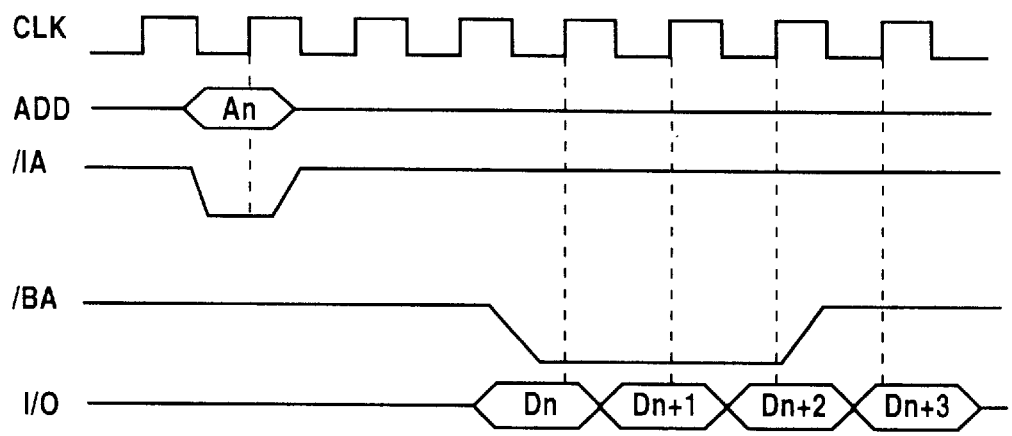
FIG. 3 is a timing chart for burst read mode.
Figure 4:
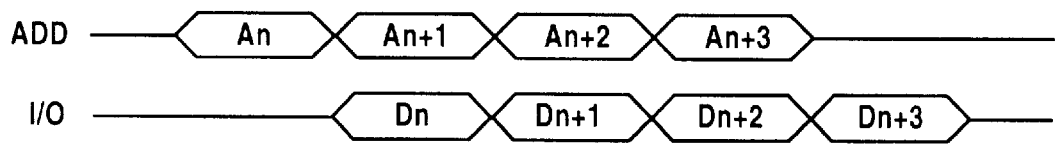
FIG. 4 is a timing chart for normal read mode.

FIG. 3 is a timing chart for burst read mode. FIG. 4 is a timing chart for normal read mode. The flash memory depicted in FIG. 2 can operate in both clock-synchronous burst read mode and clock-asynchronous normal read mode. Operations in the two read modes will now be discussed referring to the timing charts of FIGS. 3 and 4.

In the burst read mode, the burst mode switching circuit 39 sets the burst control signal 35 to burst mode (high level). Referring to FIG. 3, during the initial address /IA being low level, an externally provided address ADD is acquired by the address buffer 25, in response to the rising edge of the clock CLK. The address held in the buffer 25 functions as the lead address for the subsequent burst read. Referring to the address provided by the address buffer 25, the row decoder 22 selects one word line and the column decoder 23 selects four bit lines. As a result, four bits are output to the four sense amps SA for amplification.

The address buffer 25 also provides 2 bits address 40 to the sense amp decoder 26, whereupon the sense amp decoder 26 selects the one sense amp SA associated with the lead address, so as to cause the associated output gate 27–30 conductive. As a result, data read from the specified address is propagated to an output buffer 31 and output from an I/O terminal 37. Referring to the timing chart in FIG. 3, once the initial address /IA becomes to low level and three clock pulses have elapsed, the data Dn associated with the lead address is output synchronized with the rising edge of the clock CLK pulse. During the time that the burst address /BA (the control signal) is low level, read data in the remaining sense amps SA are delivered to the output buffer 31 synchronized with the rising edges of subsequent clock CLK pulses. In the example depicted in FIG. 3, three clock CLK pulse rising edges occur while the burst address /BA is low level; thus, read data Dn+1, Dn+2, and Dn+3 are output successively.

In the burst read described above, the address buffer 25 acquires an address ADD in synchronous with the rising edge of a clock pulse, and the output circuit outputs sense amp data in a manner synchronized with the rising edge of a clock CLK pulse, with data in the remaining sense amps SA being subsequently output synchronized with the rising edges of clock CLK pulses during the period that the burst address /BA is low level. In this way, the burst read operation is synchronized with the clock for continuous reading of a plurality of read data, making high-speed read operations possible.

In clock-asynchronous normal read mode, the burst mode switching circuit 39 sets the burst control signal 35 to normal mode (low level). Accordingly, the address buffer 25 acquires the externally provided address ADD irrespective of the clock, providing this address to the row decoder 22 and the column decoder 23. Analogously, the address buffer 25 provides a 2-bit address 40 to the sense amp decoder 26. The row decoder 22 selects one word line corresponding to the specified address and the row decoder 23 selects four bit lines corresponding to this address. Four data are then output simultaneously to the four sense amps SA for amplification.

Referring to the 2-bit address provided to it, the sense amp decoder 26 causes one of the output gates 27–30 conductive so that the output of one sense amp SA is propagated to the output buffer 31.

In the non-burst read operation described above, address is acquired asynchronously to the clock, and only one data is read out per operation. Accordingly, data Dn–Dn+3 associated with addresses An–An+3 are read out in sequential fashion in response to the addresses provided, as shown in the timing chart in FIG. 4. A 4-sets of address must provided in order to read 4 data bits, and the read operation is thus slower than in burst read mode.

Figure 5:
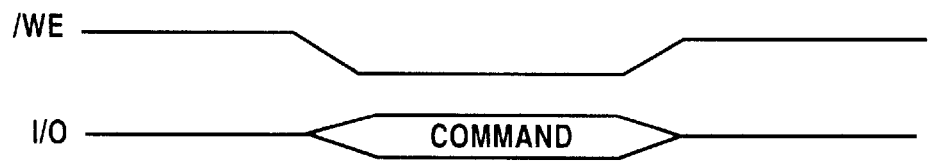
FIG. 5 is a simple timing chart for an erase or write.

The flash memory depicted in FIG. 2 also has memory cell erase and write(program) modes. In flash memory, data held in the memory cell array is erased and rewritten in block units of a certain size. A timing chart for the erase and write(program) operations is shown in FIG. 5. During the period that the control signal /WE is low level, a command presented to the plurality of input-output terminals I/O is acquired, the command is decoded, and erase mode or write mode is sensed. Depending on whether erase mode or write mode is sensed, an erase circuit or a write circuit (not shown) is controlled (accordingly). Specifically, word line level and bit line level are controlled to the levels appropriate for an erase operation or a write(program) operation.

Figure 6:
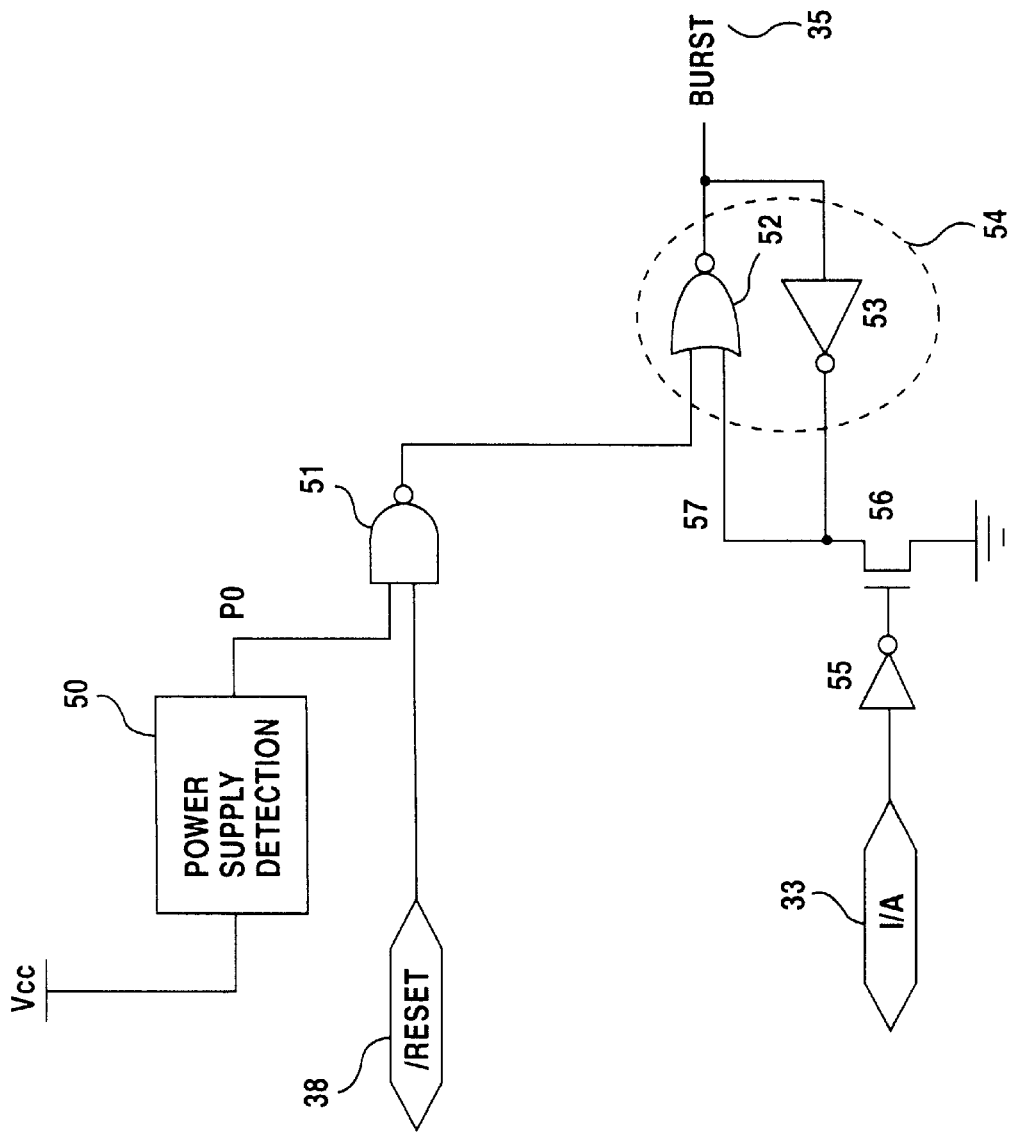
FIG. 6 depicts a first example of the burst mode switching circuit.

FIG. 6 is a diagram depicting a first example of the burst mode switching circuit. FIG. 7 shows a truth table for operation of the burst mode switching circuit of FIG. 6. An X in the truth table indicates that either high or low level is possible.

A power supply detection circuit 50 provided to the burst switching circuit of FIG. 6 detects the level of the power supply Vcc when the power is turned on; if the power supply Vcc is below a certain reference level, the detection signal P0 goes to low level, while if the power supply Vcc is above the reference level, the detection signal P0 goes to high level. A latch circuit 54 comprising a NOR gate 52 and an inverter 53 provided to the burst control circuit maintain the state of the burst control signal (BURST) 35. The latch circuit 54 state can be flipped using the output of the NAND gate 51 (which has as inputs the power supply detection signal P0 and the reset signal /RESET), or through the drain level of a transistor 56 controlled via an inverter 55 by the initial address (/IA) 33.

Referring to FIG. 7, when the power is turned on or a reset operation has been initiated, the burst mode switching circuit automatically sets the burst control signal (BURST) to low level, placing the device in non-burst mode (normal read mode). If the initial address /IA goes to low level, the burst control signal BURST is automatically set to high level, and the device assumes burst read mode.

By default, the reset signal /RESET is high level. When the power is turned on and the power supply voltage Vcc gradually rises, a low level detection signal P0 is output as long as the voltage Vcc remains below the reference value; the output of the NAND gate 51 goes to high level and the burst control signal BURST to low level, thereby establishing non-burst read mode (normal read mode). This state is depicted in Case 1 in FIG. 7. As the power supply Vcc continues to rise and reaches the reference value, a high level detection signal P0 is output and the output of the NAND gate 51 goes to high level; since the output of the inverter 53 is high level, the burst control signal BURST output by the NOR gate 52 remains unchanged at low level. Thus, non-burst read mode is maintained by the latch circuit 54. This state is depicted in Case 4 in FIG. 7.

To perform a burst read, the initial address /IA, under external control, goes to high level, whereupon the output of the inverter 55 goes to high level, forcing the n-channel transistor 56 conductive. The drain terminal 57 of the transistor 56 drops to low level, and this, in conjunction with the low level output of the NAND gate 51, switches the burst control signal BURST output by the NOR gate 52 to high level. As a result, the burst control signal BURST is set to burst read mode condition. This state is maintained by the latch circuit 54 so that burst mode state is maintained even if the initial address /IA subsequently switches back to high level.

If a reset operation is initiated in burst mode, the reset signal /RESET goes to low level; thus, in a process analogous to that when the power is turned on, the burst control signal BURST is switched back to low level, establishing non-burst read mode. This state is depicted in Case 2 in FIG. 7. This state is maintained by the latch circuit 54 so that the burst control signal BURST is maintained at low level even if the reset signal /RESET subsequently returns to high level. In this-state, if the initial address /IA goes to low level and a burst read instruction is issued, the burst control signal BURST returns to high level and burst read mode is assumed analogously to the case described earlier.

As noted in the foregoing description, the burst mode switching circuit depicted in FIG. 6 sets the mode to non-burst read mode when the power is turned on, switches the device to burst read mode if the initial address /IA goes to low level, and switches back to non-burst read mode if the reset signal /RESET goes to low level. Accordingly, the flash memory 14 depicted in FIG. 1 can be used to store programs such as the BIOS and the OS, operating in clock-asynchronous non-burst read mode when the power is turned on, and switching to clock-synchronous burst read mode when a burst read instruction is issued, affording a high speed read operation analogous to that from main memory. The use of the flash memory disclosed herein provides reduced boot-up time in personal computers.

Figure 8:
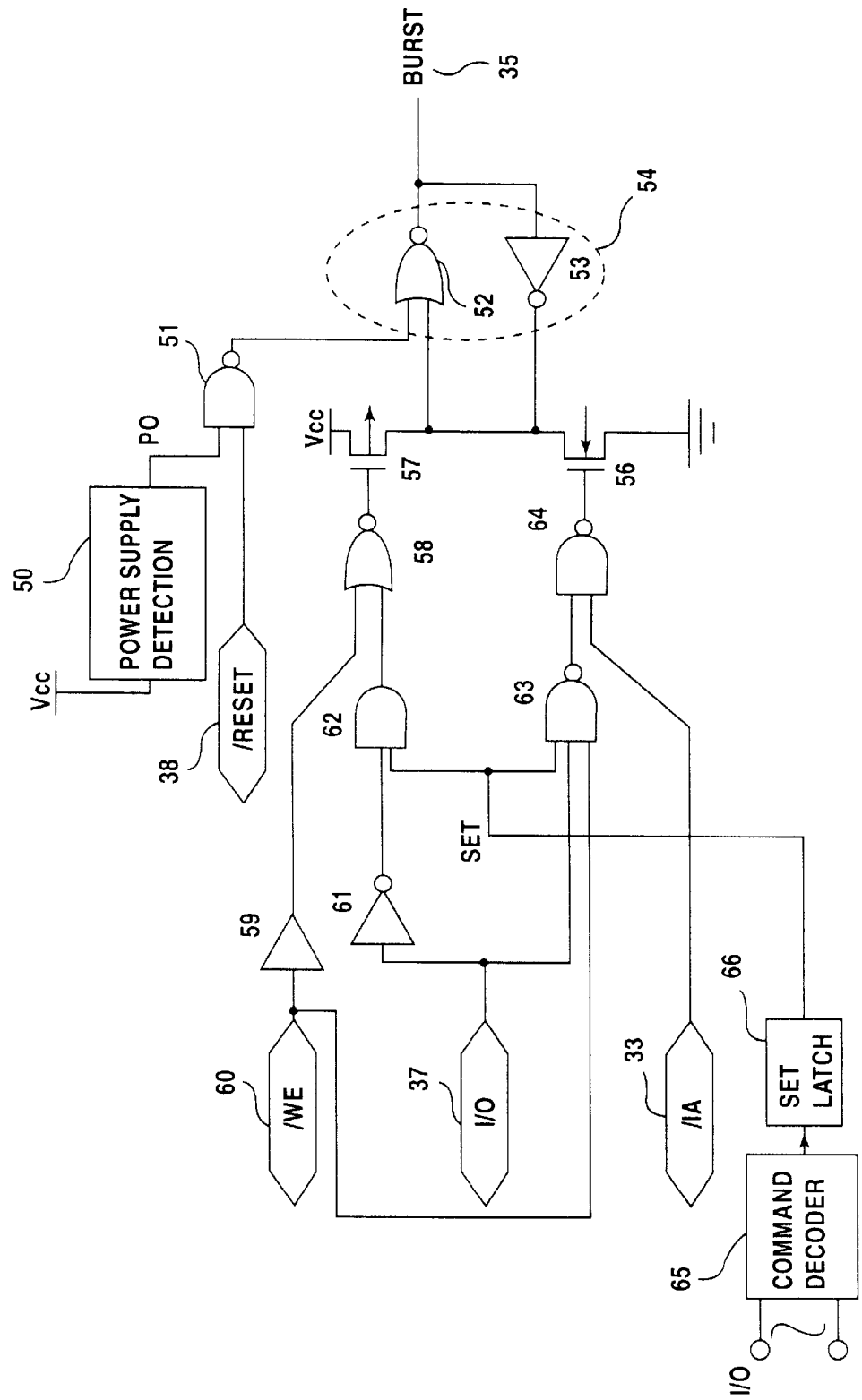
FIG. 8 depicts an alternative example of the burst mode switching circuit.

FIG. 8 depicts an alternative example of the burst mode switching circuit. FIG. 9 shows a truth table for operation of the burst mode switching circuit of FIG. 8. An X in the truth table indicates that either high or low level is possible.

As in the example depicted in FIG. 6, the burst mode switching circuit of FIG. 8 comprises a power supply detection circuit 50, a NAND gate 51 having as inputs the detection circuit output P0 and a reset signal /RESET, a latch circuit 54 comprising a NOR gate 52 and an inverter 53, and an n-channel transistor 56. Also provided is a p-channel transistor 57. The transistors 56 and 57 are controlled through a write enable signal /WE, a designated input-output terminal selected from the plurality of input-output terminals I/O(37), the initial address /IA, and a set signal SET generated from a command delivered to the plurality of input-output terminals I/O, switching latch circuit 54 to the desired state.

When the power is turned on, the power supply detection circuit 50 detects the low state of the power supply Vcc, and the output thereof P0 goes to low level; the output of the NOR gate 52 goes to low level and the burst control signal BURST is set to non-burst read mode (normal read mode, low level) (Case 10). In the event that the device is set to burst read mode, controlling the reset signal /RESET to low level switches the output of the NOR gate 52 of the latch circuit 54 to low level (Case 11). When the initial address /IA goes to low level, causing the output of the NAND gate 64 to go to high level, the transistor 56 is turned on, forcing the output of the NOR gate 52 to high level. As a result, the burst control signal BURST goes to burst read mode (high level), and this state is maintained by the latch circuit 54 (Case 14). The foregoing operations are analogous to those of the burst mode switching circuit depicted in FIG. 6.

The burst mode switching circuit of FIG. 8 is also capable of switching the burst control signal BURST to low level (non-burst read mode) in response to the write enable signal /WE going to low level during an erase or write (program) operation, enabling clock-asynchronous memory operations (Case 13). A specific command presented to the plurality of input-output terminals I/O places the set signal SET in mode-switching state (high level), and a designated input-output terminal I/O(37) is then put to high level or to low level, allowing the burst mode switching circuit to set up burst read mode or non-burst read mode (Cases 19 and 20).

As discussed in the context of FIG. 5, during an erase or write, the flash memory is presented with a specific command in response to the write enable signal /WE going to low level. When the write enable signal /WE goes to low level, the output of the inverter 59 goes to high level and the output of the NOR gate 58 goes to low level, turning on the p-channel transistor 57 and forcing the output of the NOR gate 52 to low level. As a result, the burst control signal BURST goes to low level (non-burst read mode), and this state is maintained by the latch circuit 54 (Case 13). Accordingly, in this state the flash memory is operated in clock-asynchronous mode.

Referring to the circuit-depicted in FIG. 8, when a specific command is input to the plurality of input-output terminals I/O, the command is decoded by the command decoder 65 and the output SET of the set signal latch circuit 66 is maintained at high level. This represents the mode-setting state. When the designated input-output terminal I/O(37) subsequently goes to high level, all of the inputs to the NAND gate 63 become high level, so the output thereof goes to low level. Accordingly, the output of the NAND gate 64 goes to high level, the transistor 56 is turned on, the output of the NOR gate 52 goes to high level, and the burst control signal BURST is set to burst read mode (high level) (Case 20).

With the device in the mode-setting state (SET=H), if the designated input-output terminal I/O(37) goes to low level, all of the inputs to the AND gate 62 become high level, so the output thereof goes to low level. Accordingly, the output of the NOR gate 58 goes to low level, the transistor 57 is turned on, the output of the NOR gate 52 goes to low level, and the burst control signal BURST is set to non-burst read mode (low level), the clock-asynchronous state (Case 19).

Figure 10:
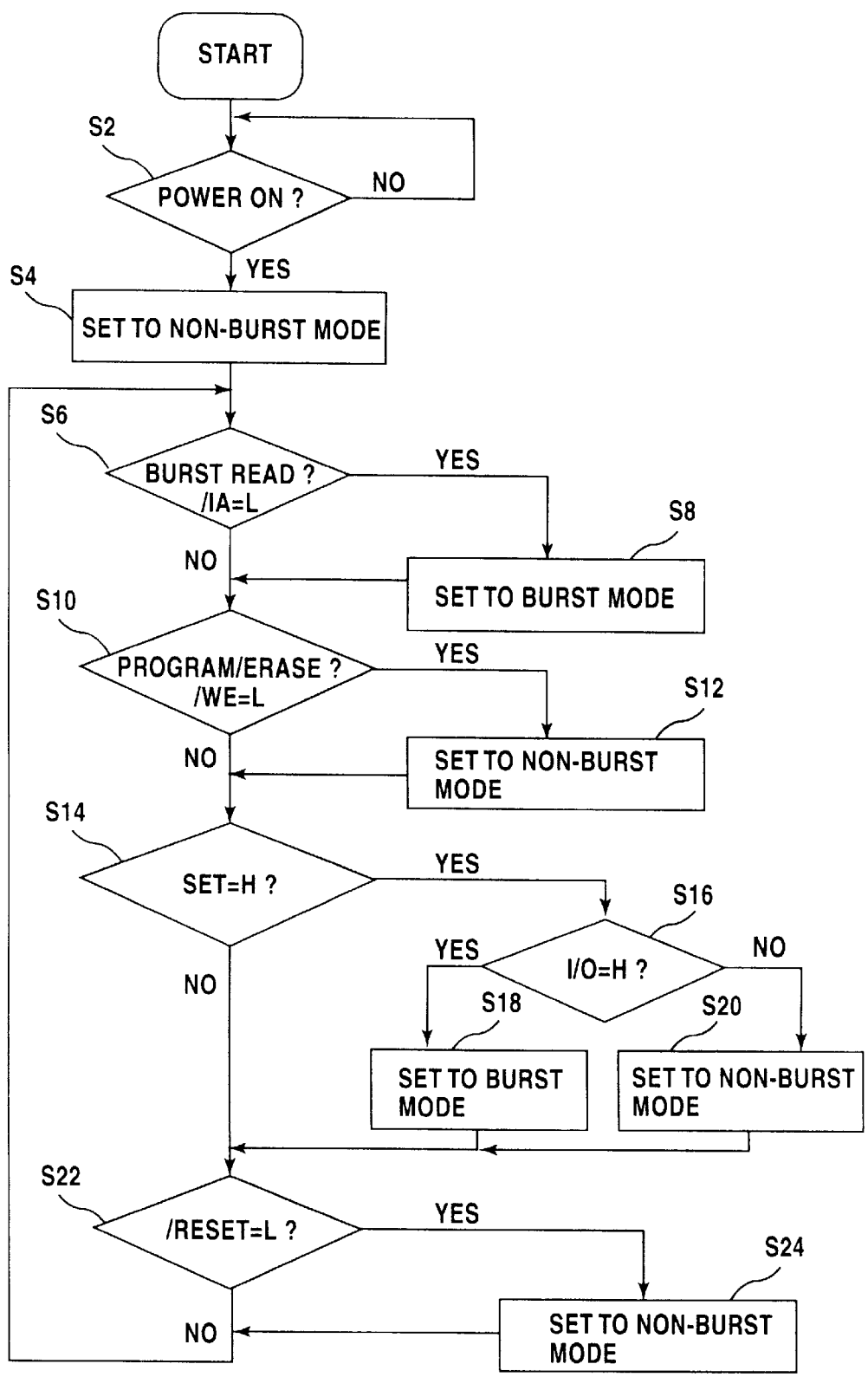
FIG. 10 is a flow chart of operation of the burst mode switching circuit of FIG. 8.

FIG. 10 is a flow chart depicting operation of the burst-mode switching circuit of FIG. 8. As noted in the preceding discussion, turning the power on (S2) automatically sets the device to non-burst mode (S4). When the initial address /IA subsequently goes to low level to instruct a burst read (S6), burst read mode is established (S8). When a write enable signal /WE instructing an erase or write (program) goes to low level (S10), the device is switched back to non-burst read mode for clock-asynchonous operation (S12).

Inputting a specific command to the plurality of input-output terminals I/O causes the internal set signal SET to assume high level (S14), and depending on whether the subsequent designated input-output terminal I/O(37) is high level or low level, burst read mode or non-burst read mode is assumed (S16, S18, S20). If the reset signal /RESET is switched to low level in a reset operation (S22), the device is forced into non-burst read mode (S24).

With the device in mode-setting status, setting the mode through the designated input-output terminal I/O(37) is accomplished by putting the set signal SET to high level and then putting the designated input-output terminal I/O(37) to high level or low level to enable the mode to be set. The purpose of this configuration is that since the write enable signal /WE at low level represents command input status, mode setting in mode setting status should be distinguished from an erase or write during /We at low level.

Burst read and normal asynchronous read operations in the flash memory are analogous to those in ordinary SDRAM and similar memories.

While the foregoing description of embodiments of the invention employed the example of flash memory, the present invention is not limited to flash memories and other such nonvolatile memories, having potential application in other types of semiconductor memory devices as well. The invention could be used to similar advantage in any memory device of which both a clock-synchronous burst read mode and an asynchronous non-burst read mode are required.

According to the invention disclosed herein, there is provided a memory circuit having both a clock-synchronous burst read mode and an asynchronous non-burst read mode, the device automatically assuming non-burst read mode when the power is turned on, and being capable of being switched to burst read mode through a control signal instructing a burst read. The device can be switched back to non-burst mode through a reset operation as well.

What is claimed is:

1. A memory circuit including nonvolatile memory cells, comprising:
    an output circuit for executing clock-synchronous burst read operation and clock-asynchronous normal read operation of data read from the memory cells; and
    a burst mode switching circuit for setting the output circuit to the normal read mode in response to power ON, and for setting the output circuit to the burst read mode in response to a specific control signal provided from outside.

2. The memory circuit according to claim 1, wherein the burst mode switching circuit sets the output circuit to the normal read mode in response to a reset operation.

3. The memory circuit according to claim 1 or 2, wherein the burst mode switching circuit comprises a latch circuit for supplying a burst control signal to the output circuit and latching the burst control signal in a burst read state when the burst read mode is set.

4. The memory circuit according to claim 1, wherein the burst mode switching circuit set into the normal read mode in response to an externally provided erase or write control signal.

5. The memory circuit according to claim 1, further comprising a plurality of input terminals,
    wherein the burst mode switching circuit assumes mode-switching status in response to a specific command presented to at least one of the plurality of input terminals, and when placed in mode-switching status, in response to a mode switching signal supplied to any of the plurality of input terminals, switches the output circuit between the burst read mode and the normal read mode corresponding to the mode switching signal.

6. A memory circuit switchable in response to a burst control signal between a clock-synchronous first read mode and a clock-asynchronous second read mode:
    wherein, in the first read mode, address signals are acquired in synchronous with a clock during a first control signal being at activation level, and a plurality of read data are output in synchronous with the clock during a second control signal being at activation level after a prescribed time interval after the first control signal being at the activation level; comprising a burst mode switching circuit for setting the burst control signal to the second read mode condition when the power is turned on, and for setting the burst control signal to the first read mode condition in response to the first control signal being at the activation level.

7. The memory circuit according to claim 6, wherein the burst mode switching circuit sets the burst control signal to the second read mode in response to a reset operation.

8. The memory circuit according to claim 6, further comprising a plurality of input terminals,
    wherein, with a third control signal at activation level, memory cells are erased or written to in response to an erase or write command presented to at least one of the plurality of input terminals; and the burst mode switching circuit sets the burst control signal to the second read mode state in response to the third control signal at the activation level.

9. The memory circuit according to claim 8, wherein, with the third control signal at the activation level, the burst mode switching circuit assumes a mode-switching state in response to a specific command presented to at least one of the plurality of input terminals, and when placed in mode-switching status, in response to a mode switching signal supplied to any of the plurality of input terminals, switches the burst control signal to the first or second read mode state corresponding to the mode switching signal.

10. The memory circuit according to any of claims 6 through 9, provided with nonvolatile memory for holding stored data with the power off.

* * * * *